(12) United States Patent
Wallace et al.

(10) Patent No.: US 9,843,802 B1
(45) Date of Patent: Dec. 12, 2017

(54) METHOD AND SYSTEM FOR DYNAMIC COMPRESSION MODULE SELECTION

(75) Inventors: Grant R. Wallace, Pennington, NJ (US); Philip N. Shilane, Yardley, PA (US); Frederick Douglis, Basking Ridge, NJ (US); Jianqiang Luo, Santa Clara, CA (US)

(73) Assignee: EMC IP Holding Company LLC, Hopkinton, MA (US)

( * ) Notice: Subject to any disclaimer, the term of this patent is extended or adjusted under 35 U.S.C. 154(b) by 640 days.

(21) Appl. No.: 13/436,641

(22) Filed: Mar. 30, 2012

(51) Int. Cl.
G06K 9/36 (2006.01)
H04N 19/10 (2014.01)
H04L 12/811 (2013.01)

(52) U.S. Cl.
CPC .............. *H04N 19/10* (2014.11); *H04L 47/38* (2013.01)

(58) Field of Classification Search
CPC .................................. H04N 7/30; H04N 7/50
USPC .............. 341/50, 51; 707/692, 693; 709/247
See application file for complete search history.

(56) References Cited

U.S. PATENT DOCUMENTS

| | | | | |
|---|---|---|---|---|
| 5,406,279 A * | 4/1995 | Anderson | ........... | H03M 7/3086 341/51 |
| 5,467,087 A | 11/1995 | Chu | | |
| 5,608,396 A * | 3/1997 | Cheng | ..................... | G06T 9/005 341/106 |
| 5,687,256 A | 11/1997 | Kimura | | |
| 5,978,757 A | 11/1999 | Newton | | |
| 6,624,761 B2 * | 9/2003 | Fallon | ....................... | G06T 9/00 341/51 |
| 7,069,342 B1 * | 6/2006 | Biederman | ................... | 709/247 |
| 7,133,228 B2 | 11/2006 | Fung et al. | | |
| 7,386,046 B2 | 6/2008 | Fallon et al. | | |
| 7,460,032 B2 * | 12/2008 | Boldt et al. | ..................... | 341/50 |
| 7,474,793 B2 | 1/2009 | Weissman et al. | | |
| 7,692,808 B2 * | 4/2010 | Takahashi | ............ | H04N 1/6058 358/1.15 |
| 7,911,509 B2 | 3/2011 | Jendbro | | |
| 8,135,683 B2 * | 3/2012 | Douglis | .............. | G06F 11/1453 707/693 |
| 8,250,335 B2 * | 8/2012 | Whyte | .................. | G06F 3/0608 711/114 |
| 8,407,193 B2 * | 3/2013 | Gruhl | .................... | G06F 3/0608 707/693 |
| 8,417,833 B1 | 4/2013 | Amdahl | | |
| 8,427,347 B1 * | 4/2013 | Chai et al. | ....................... | 341/51 |
| 8,447,740 B1 * | 5/2013 | Huang et al. | ................. | 707/692 |

(Continued)

OTHER PUBLICATIONS

Non-Final Office Action, U.S. Appl. No. 13/436,680, dated Oct. 6, 2014, 13 pages.

(Continued)

*Primary Examiner* — Vikkram Bali
*Assistant Examiner* — Xuemei Chen
(74) *Attorney, Agent, or Firm* — Blakely, Sokoloff, Taylor & Zafman LLP

(57) ABSTRACT

A computer-implemented method for compressing a data set, the method comprising receiving a first data block of the data set, selecting automatically by a compression management module a compression module from a plurality of compression modules to apply to the first data block based on projected compression efficacy or resource utilization, and compressing the first data block with the selected compression module to generate a first compressed data block.

20 Claims, 6 Drawing Sheets

(56) References Cited

U.S. PATENT DOCUMENTS

| | | | |
|---|---|---|---|
| 8,478,731 B1 | 7/2013 | Throop et al. | |
| 8,484,356 B1 | 7/2013 | Douglis et al. | |
| 8,499,100 B1* | 7/2013 | Rothstein | H03M 7/30 375/240 |
| 8,566,286 B1* | 10/2013 | Hawton | G06F 17/30 707/654 |
| 8,694,703 B2 | 4/2014 | Hans et al. | |
| 8,712,978 B1* | 4/2014 | Shilane et al. | 707/693 |
| 8,806,062 B1* | 8/2014 | Vertongen et al. | 709/247 |
| 9,026,740 B1* | 5/2015 | Shilane | G06F 12/0862 707/722 |
| 9,411,815 B1* | 8/2016 | Lu | G06F 17/30153 |
| 2004/0114809 A1 | 6/2004 | Kim | |
| 2005/0210122 A1 | 9/2005 | Taylor | |
| 2007/0288556 A1* | 12/2007 | Anton | H04N 21/2312 709/203 |
| 2010/0231734 A1 | 9/2010 | Cai | |
| 2013/0290615 A1 | 10/2013 | Shah | |

OTHER PUBLICATIONS

Non-Final Office Action, U.S. Appl. No. 13/436,677, dated Oct. 7, 2014, 10 pages.

Non-Final Office Action, U.S. Appl. No. 13/436,680, dated Mar. 25, 2015, 23 pages.

Lu, Guanlin, et al, "Frequency Based Chunking for Data De-Duplication," 18th Annual IEEE/ACM International Symposium on Modeling, Analysis and Simulation of Computer and Telecommunication Systems, Aug. 17-19, 2010, 10 pages.

Final Office Action, U.S. Appl. No. 13/436,677, dated Mar. 23, 2015, 14 pages.

Final Office Action, U.S. Appl. No. 13/436,680, dated Dec. 10, 2014, (12 pages).

Office Action mailed Apr. 22, 2015 for U.S. Appl. No. 13/436,680, filed Mar. 30, 2012, 13 pages.

* cited by examiner

METHOD AND SYSTEM FOR DYNAMIC COMPRESSION MODULE SELECTION

CROSS REFERENCE TO RELATED APPLICATION

This application is related to co-pending patent application entitled "A METHOD AND SYSTEM FOR DYNAMIC COMPRESSION MODULE SELECTION," Ser. No. 13/436,677 and co-pending patent application entitled "A METHOD AND SYSTEM FOR DYNAMIC COMPRESSION MODULE SELECTION," Ser. No. 13/436,680 filed on the same date as the present application and commonly owned. The cross-referenced applications are incorporated herein by reference.

FIELD

The embodiments of the invention relate to a method and system for optimizing the storage of client system data. Specifically, the embodiments of the invention relate to a method and system for adapting the compression process to optimize the compression to throughput ratio during a compression process.

BACKGROUND

Data compression is utilized to reduce storage space for large files or data structures by encoding the information using fewer bits than the original data set. The data compression can be either lossy or lossless. Lossy compression reduces the number of bits, at least in part, by discarding less important or critical information or approximating the information. Lossless compression reduces the number of bits by identifying and reducing statistically redundant bits. Use of compression in either form is useful for reducing the required storage capacity of systems, transmission rates of network connections and similar computational resources. Some compression processes are not well suited for compressing certain data sets. A user can manually select a compression process that is well suited for a particular data set to improve the compression level of the data set. One example application of data compression is in backup storage management systems.

Backup storage management involves the collection of client data from a set of client systems that is to be stored remotely as a backup to the client data of the set of client systems in the case of a failure or corruption of the client data. For large scale systems, backup storage management systems attempt to minimize the storage, processing and communication resources required for client data to be backed up. This optimization includes the compression and de-duplication of the client data. However, the compression and de-duplication process also increases the overhead of the backup storage process. In some cases, the type of compression utilized in the backup process is ineffective where the client data set is not amenable to the type of compression process utilized or where the type of compression process is more resource intensive than would be available to compress a given client data set. Efforts to improve on the compression process are based on matching the content type with a particular type of compression process that is efficient at compressing that content type. This involves the manual correlation of the content type with the type of compression process or a specific compression process. This approach may only be applicable where the data to be compressed is of a known type and discretely separated from other differing types of content.

For example, some compression processes are efficient at compressing image data. If data to be compressed are identified to be image data, then the administrator managing the compression process can select a compression process that is efficient at compressing such image data. However, some applications of compression are the context of a general environment, such as a large scale backup management system, which may service a wide variety of clients and backup a wide variety of content even within specific client data sets. The process of individually specifying or correlating content with compression algorithms that are efficient is too time and resource intensive because it requires a manual correlation and sufficient information about the client data set. As a result, general environments such as backup storage management systems use general compression processes that have the ability to compress many different types of content with a moderate level of efficiency (i.e., moderate compression levels and moderate resource consumption). However, as a result of the use of these general compression processes, there are many instances where resources could have been more efficiently allocated by using a different compression process.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one.

DETAILED DESCRIPTION

Figure 1A:
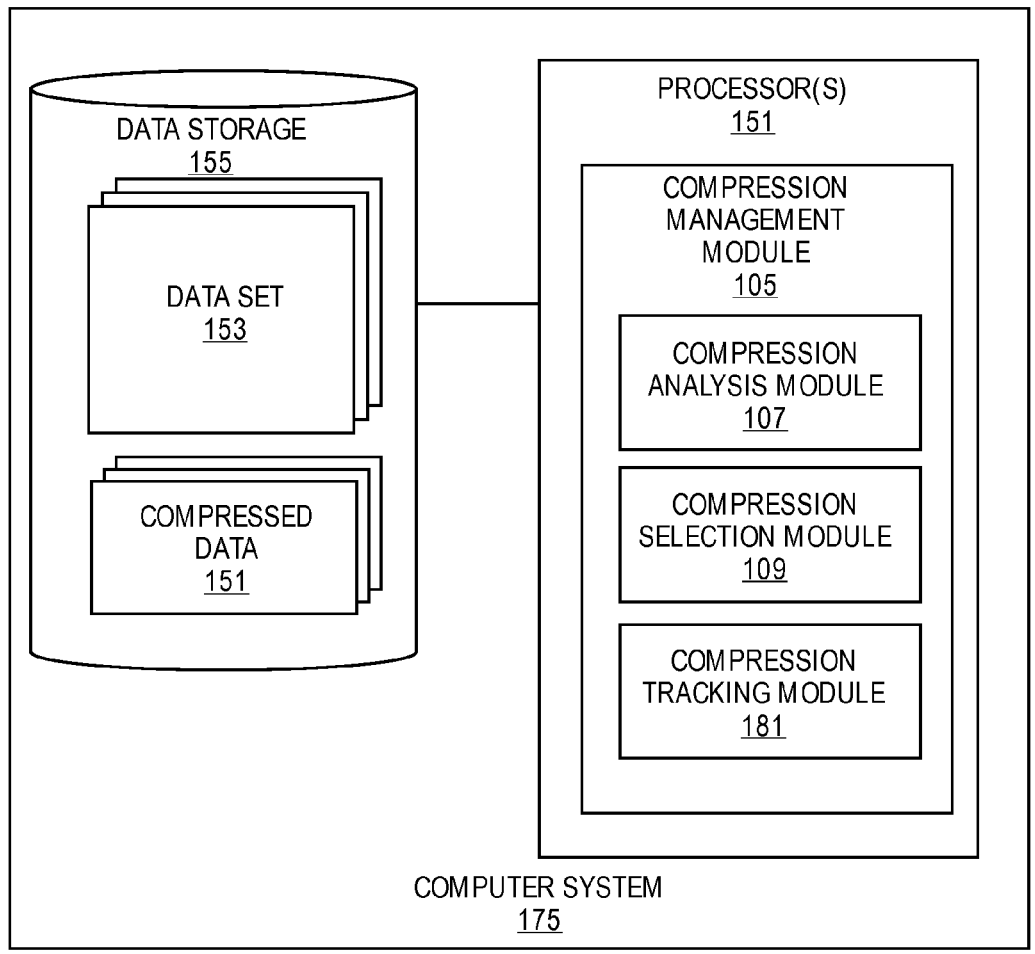
FIG. 1A is a diagram of one embodiment of a system implementing a dynamic compression module selection process.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present invention.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment. A 'set,' as used herein refers to any positive whole number of items including one item. Data that is 'received' or 'forwarded' by a component can be received by network transmission, a local read or write operation, a system call or similar process for passing data between components of a computer system or over a network.

In one example embodiment, a backup data storage system is a deduplicated storage system having a set of storage units. The backup data storage system embodiment is provided by way of example and not limitation. One skilled in the art would understand that the structures, principles and methods described in relation to this example are applicable to other systems where compression is utilized. Each of the storage units is configured to store data chunks that are deduplicated within each of the data storage units, where the files stored in the storage system are comprised of the data chunks. Each data chunk is formed through a specific policy, e.g. by breaking a file based on properties of the content in the file, which permits changes to one data chunk without affecting the boundaries or contents of other chunks.

Compression processes or modules as used herein refer to particular sets of operations for attempting to reduce the size of a data chunk or similar unit of data. These compression processes or modules can incorporate such compression algorithms as Lempel-Ziv (LZ) compression methods such as GZIP, PKZIP and similar processes. Other types of compression methods and processes including both lossless and lossy data compression can be utilized individually or in any combination. As used herein, a compression module is considered strictly more efficient if it produces more data reduction with the same resources or uses fewer resources for the same amount of data reduction. Typically, to achieve better compression, more computational resources are required, i.e. the compression module has reduced throughput, but achieves better compression. A compression module that achieves a significantly higher level of compression will typically be significantly slower (or require significantly more processing) than a compression module that achieves less compression.

In addition to compression module efficiency, data blocks have inherent properties which influence how much compression can be achieved on that block. A block may be highly compressible even when using a simpler compressor or it may be incompressible even when using an advanced compressor. In one embodiment, a block is highly compressible if a typical compression module reduces the bits or size of a data set by more than ninety percent or where the size of the resulting compressed data set is ten percent or less of the size of the original. Conversely, a block has low compressibility if a typical compression module reduces the bits or size of the data set by less than ten percent or that actually increases the size of the data set. Compressibility that falls between the ten percent and ninety percent thresholds of low and high compressibility are referred to herein as a mid-range of compressibility. One skilled in the art would understand that what is considered high, low or mid range of compressibility can vary depending on the data set, compression modules, and similar factors.

FIG. 1A is a diagram of one embodiment of a system implementing a dynamic compression module selection process. The compression module selection process can be implemented within a computer system 175 or can be distributed across any number of computer systems. The data sets 153 to be compressed can be locally stored in a storage device 155 or can be accessible over any communication medium such as a communication network such as a local area network (LAN), a wide area network (WAN), such as the Internet or similarly accessible to the computer system 175. The computer system 175 can be any type of computer system including a desktop computer, laptop computer, handheld computer, console device, tablet, smartphone or similar computer system. The computer system 175 can include any number or type of processors 151 that execute the components stored therein and can retrieve or store data in data storage 155. The data storage 155 can be any type of dynamic or persistent storage device or any combination thereof including optical, magnetic, solid-state or similar storage medium.

The dynamic compression module selection process can be implemented by a compression management module 105. The compression management module 105 can include a compression analysis module 107 and compression selection module 109. The compression management module 105 retrieves the data set 153 and provides it to the compression analysis module 107. The compression analysis module 107 determines whether the data set 153, recent compression history, collected statistical data or similar information indicate whether the current compression module or prior compression module has been effective. The compression selection module 109 selects a new compression module to apply to the data set 153. The compressed data 157 and/or any associated meta-data that is generated by the application of the compression module is stored in the data storage 155 or similar location. The dynamic compression module selection process is described in further detail herein below.

Figure 1B:
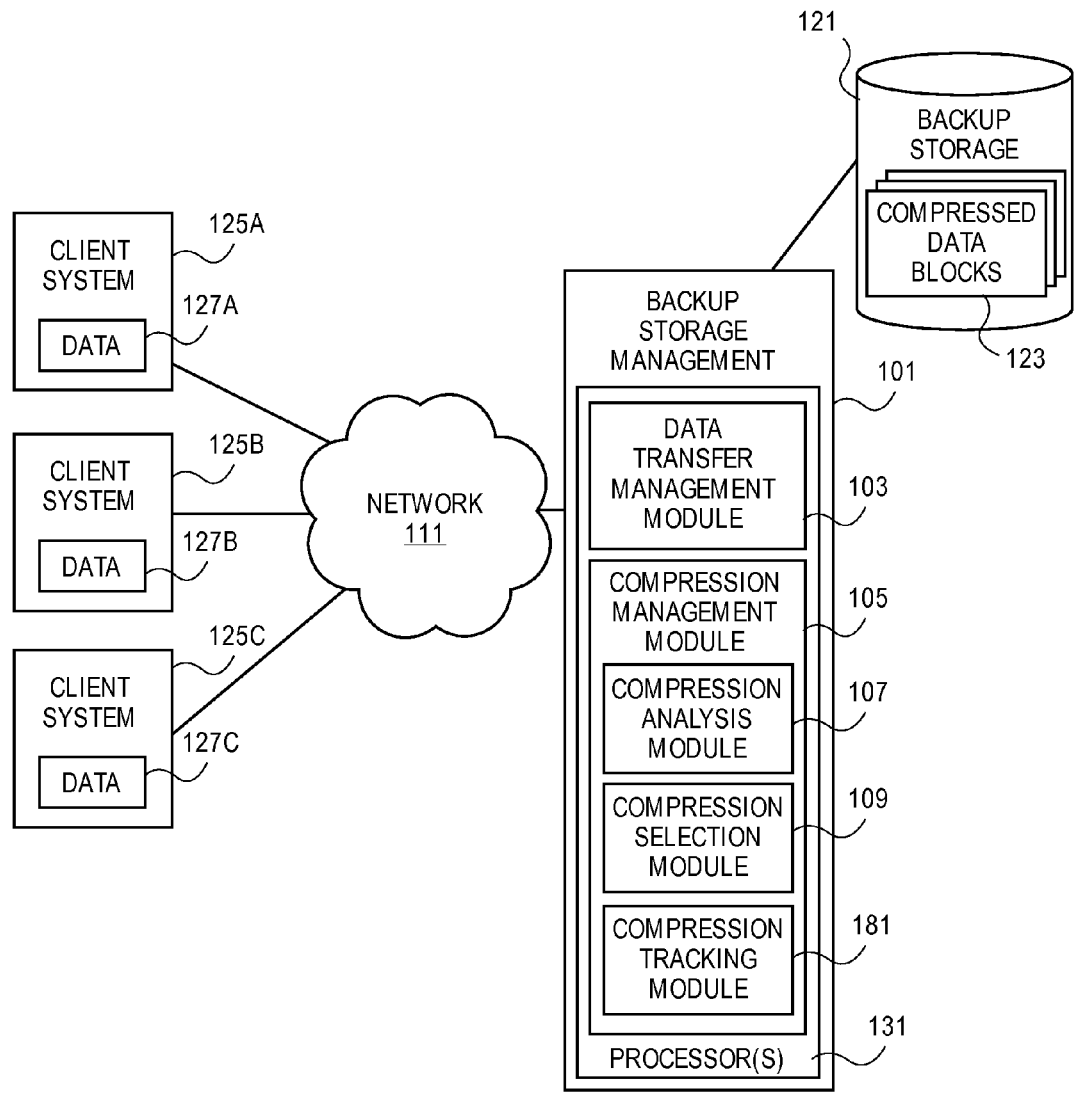
FIG. 1B is a diagram of one embodiment of a backup storage management system implementing a focused local compression process.

FIG. 1B is a diagram of one example embodiment of a backup storage management system implementing the dynamic compression module selection process. The system includes a set of client systems, 125A-125C connected through a network 111 to a backup storage management system 101. The client systems 125A-125C can be any type of computer systems including servers, desktops, desktop computers, handheld computers, work stations and similar computer systems. Each of the client systems 125A-125C can be separately controlled or can be within the control of the same organization or administrators. The client system 125A-125C can be controlled or administered by the same organization as the backup storage system 101 or can be separately owned and administered from the backup storage management system 101 where the backup management system 101 is provided by an external vendor or provider.

The client data 127A-127C stored within the client systems 125A-125C can be any type and variety of data including documents, images, databases and other types of data sets as well as any combination thereof. These data sets can be accessed and transferred to the backup storage management system 101 to be stored in the backup storage 121 as a set of compressed data blocks 123. This transfer is performed primarily by the data transfer management module 103. The client systems 125A-125C, in one embodiment, can also include a set of local clients that coordinate with the data transfer management module 103 and the backup storage management system 101 to effect the transfer of the data sets 127A-127C.

The client systems 125A-125C can be connected to the backup storage management system 101 over a network 111. The network 111 can be any type of network including a local area network (LAN), a wide area network (WAN), such as the Internet or similar network. Further, the client systems 125A-125C can be connected through multiple networks or to the backup storage management system 101. The network 111 can encompass any combination of wired or wireless communication mediums and can encompass any number of intermediate computing and network devices.

The backup storage management system 101 can be implemented as a server or set of servers executing each of the modules therein including a data transfer management module 103 and a compression management module 105. Those skilled in the art would understand that the module is an organization of the backup storage management system 101 and is provided by way of example and limitations and that other organizations of the functions and modules are possible and they could be distributed over any number of individual servers, processors or similar hardware components.

Similarly, the backup storage 121 can be any type of storage device or array of storage devices or set of servers containing such devices. The storage devices may include magnetic storage discs, optical storage discs, solid state memories and similar storage technology devices. The backup storage devices 121 can be local or separate from the backup storage management system 101. They are connected by any type of network or data connection.

The data transfer management module 103 can communicate with the client systems 125A-125C using any type of communication protocol to retrieve and effect the transfer of the data sets, 127A-127C. The data sets once received at the backup storage management system 101 can then be provided to the compression management module 105 and similar components. In one embodiment, the backup storage management system 101 also includes a data de-duplication module that de-duplicates the redundant data within the data sets 127A-127C. This de-duplication can be done prior to the compression of the data by the compression management module 105. In further embodiments, the data transfer module 103 incorporates such de-duplication processes. The de-duplication and the compression can be done at the time of the data transfer, on the fly, as the data is received by the backup storage management system 101 and prior to the storage of the data as compressed data blocks 123 in the backup storage 121.

In other embodiments, the data sets 127A-127C can be retrieved and stored in the backup storage 121 or similar storage location prior to being de-duplicated or compressed depending on the resources available to the backup storage management system 101 and the loads on the backup storage management system 101 and its set of processors 131 and similar resources. The backup storage management system 101 can incorporate any number of processors 131 or processing devices that are within a single server or a set of servers that implement the backup storage management system 101. These processors 131 execute the modules of the backup storage management system 101, which can be stored in the local memory of a local storage device and executed by the processors 131 in combination with working memory and similar resources within the backup storage management system 101.

The compression management module 105 receives data and can be called by the data transfer management module or other components of the backup storage management system 101 when there is data received from the client systems 125A-125C as decompressed either before or after the storage or the backup storage system 121. The compression management module 105 can include a compression analysis module 107 and a compression selection module 109. In one embodiment, the compression analysis module 107 analyzes either incoming or recently received or uncompressed data set information 127A-127C or recently compressed data set information. The analysis is described in further detail herein below in regard to the varying embodiments of the focused local compression process.

Similarly, the compression selection module 109 can select any of a plurality of available compression processes based on the output of the compression analysis module 107 that assists the compression selection module 109 in identifying the optimal compression process to be applied to the data sets 127A-127C that are to be compressed. The compression and selection module processes are further described herein below in regard to the varying embodiments of the compression selection process.

Figure 2:
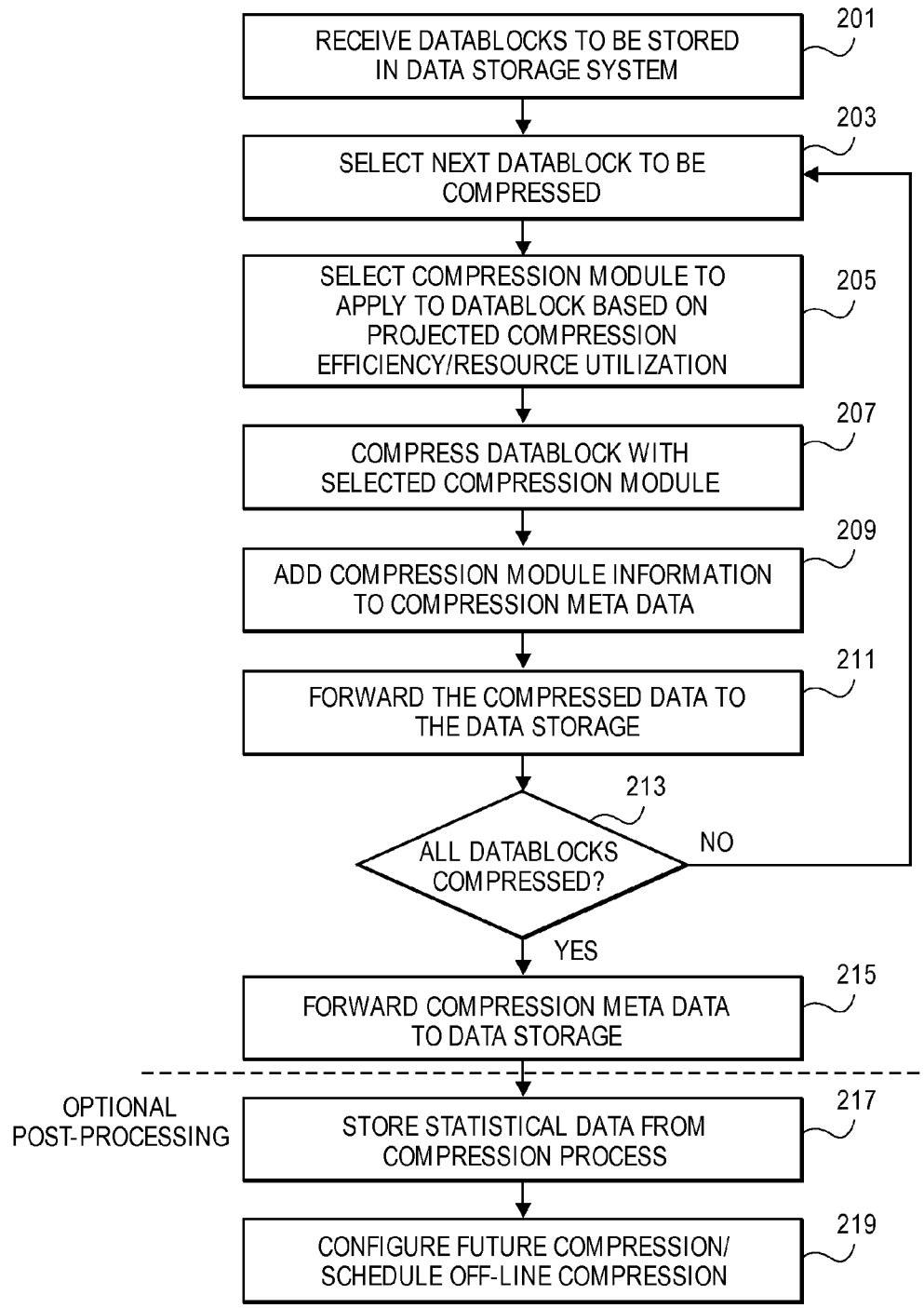
FIG. 2 is a flowchart of one embodiment of a process for dynamically selecting a compression process to obtain a desired compression to throughput ratio.

FIG. 2 is flowchart of one embodiment of the dynamic compression selection process. In one embodiment, this process is initiated by a compression management module accessing a data set or receiving a data set to be compressed. In other embodiments, a client system or the data transfer management module can initiate the provision of the data set to be compressed, whereby the data set from the client is transferred from the client system to the backup storage management system. This data set is then provided to the compression management module for analysis and compression.

The compression management module receives the data blocks to be stored in the data storage or similar location (e.g., backup data storage system) (Block 201) as a stream or as an intermittent flow of data from the data storage, set of data storage devices, client system or set of client systems. As the data blocks are received, the compression management module selects the next data block to be compressed (Block 203). The data blocks can have any size or number. The data blocks can be processed serially or in parallel. In one embodiment, they are processed in the sequence in which they are received or roughly in the sequence they are received if being processed in a parallel fashion.

The selected data block is then assigned a compression module applied to the data block, which is selected based on a projected compression efficacy or resource utilization (Block 205). The compression module or process that is being applied can be selected based on assumed properties of data blocks, a specific designation of a default compression module or a similar configuration. In other embodiments, the compression module can be selected based on a pre-processing or sampling of the incoming data blocks to identify the type of content and to match it with an optimal compression module for that content. In still further embodiments, the compression module can be selected based on efficacy of recently used compression modules or sampling of recently compressed data to identify whether the recently compressed data has been efficiently compressed and select a new compression module if the compression is not efficient or if an analysis of the recently compressed data indicates that a different type of compression module would be more efficient given the type or pattern of the data blocks having been recently compressed.

In further embodiments, the selection of the compression module can be affected by an analysis of the computational resources available or predicted to be available or required by the compression process for a set of available compression modules. Where there are sufficient computational resources, the selection of the compression module can encompass the use of more computationally resource intensive compression modules. In the instances where computational resources are limited, the selection of the compression modules can be constrained to the less resource intensive compression modules. Any sort of sliding scale or similar application of the trade-off between available computational resources and the computational requirements of the compression modules can be employed to either constrain or expand a set of available compression modules or to be taken directly into consideration in selecting the compression module along with other criteria as discussed herein above.

The currently selected data block is then compressed with the selected compression module (Block 207). The compression module information is added to a set of compression meta-data that is maintained for the current compression process for a given data set (Block 209). The compression meta-data can include an identification of a compression module that is utilized on a per data block basis or a group of data blocks. The meta-data can include the compression module that has been applied as well as any efficacy information related to the compression module's application to the data block. This compression meta-data can also be examined during the compression module selection state to assist in future compression module selections, especially those that are based on historical or recent compression analysis.

Once the compression of the data block has completed and the compression module information added to the compression meta-data, the compressed data can be forwarded to the data storage system or similar location (e.g., a backup storage system) to be added to the compressed data (e.g., a backup storage file) for the current data set being processed (Block 211). The compression management module then checks whether all data blocks for a data set have been compressed (Block 203). If all the data blocks have not been compressed, then the process continues to the next selected data block to be compressed (Block 203). In one embodiment, an end of file is reached or similar indicator of an end of a data set. In another embodiment, a client system can send a notification of an end of data stream or similar indicator can be received to notify the compression management module of the end of the stream of data blocks that are to be compressed and stored.

Once all of the data blocks have been compressed, then the compressed data can be forwarded to the data storage or similar storage location (e.g., a backup storage system) and the meta-data collected during the compression of the data stream for a particular data set can also be forwarded to the data storage (Block 205). This meta-data can be used for future analysis and selection of compression modules for similar data or for a particular client system or under similar circumstances during any future backup process. In further embodiments, the meta-data is stored incrementally with the compressed data blocks, rather than at the completion of the compression process.

In some embodiments, additional post processing of the meta-data and the compressed data may be performed including storing statistical data from the compression process derived from or stored directly in the meta-data or separately maintained by the compression module (Block 217). Any type or amount of statistical data such as a compression ratio, content types identified and similar information can be stored with the statistical data. The statistical data can also be matched with a particular compression process, a particular client, particular data set or similarly identified. In other embodiments, the statistical data may be anonymized or similarly modified to protect the privacy of the owner of the system executing the compression management module, the owner of a client system or other participants, such that the statistical data can also be pooled with other statistical data from other compression management modules, clients and client systems and data sets without compromising the privacy of any particular participant, client or owner of the data sets.

The meta-data and compressed data can also be analyzed to configure future compression or schedule off line compression for the data sets that have been compressed and stored in the data storage or similar storage location (e.g., a backup storage system). For example, the compressed data can be scheduled for further off line compression using the compression processes that are shown to provide a higher level of compression than the compression module that had been applied. The compression process can track those sets of data blocks that are amenable to higher levels of compression but where more efficient compression is utilized to maintain the compression to throughput ratio.

Figure 3:
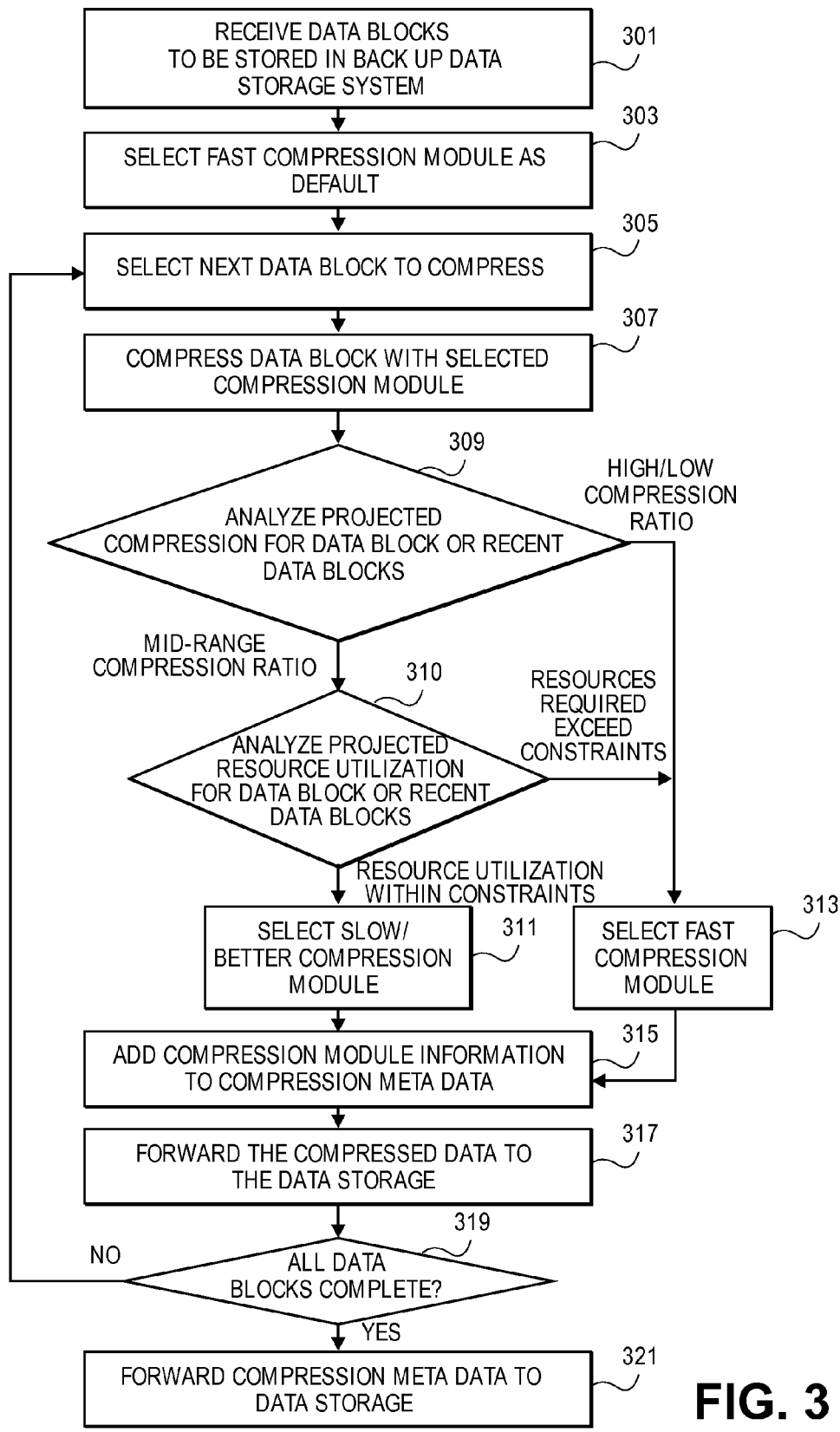
FIG. 3 is a diagram of one embodiment of a dynamic compression selection process that relies on analysis of previously compressed data.

FIG. 3 is a diagram of one embodiment of the process for dynamic compression selection utilizing an analysis of recent compression history. In one embodiment, this process is initiated by the compression management module at the direction of a user or under similar circumstances. The data set can be provided to the compression module as a set of data blocks to be compressed and to be stored in the data storage or similar storage location (e.g., a backup data storage system) (Block 301). A fast compression module can be selected as a default compression module (Block 303). Such compression modules can include Lempel-Ziv and similar compression processes. These compression modules are highly efficient in terms of the resources and time required to compress the data but do not provide the highest level of compression. In a sense, these fast compression modules can be utilized in this process as a test of the data to be compressed. Data that is amenable to high compression even with the fast compression module or is uncompressible with any type of compression module can be discerned by the application of these fast compression modules.

The compression management module selects the next data block from those received to be compressed (Block 305). As discussed above, the data blocks can be any size, number or grouping of data blocks. The selected data block is then compressed with the currently selected compression module (Block 307). After the compression (immediately or at any point thereafter), the data block can be analyzed along with other previously compressed data blocks to determine the level of compression, resource utilization, ratio of the throughput to the compression and similar factors (Block 309). If a very high or very low compression has been achieved, then the fast compression module is selected or re-confirmed for continued use (Block 313). However, if a mid-range (or average) compression efficacy is achieved on the data, then a better compression module, that is a compression module capable of a higher degree of compression is selected (Block 311). In each case, the assumption is that locality of data blocks will indicate that the next data block to be compressed will also have similar compression characteristics and will benefit from the switch to the more appropriate compression module. In one embodiment, a check on available resources is performed (Block 310) and if within defined constraints then the slow/better compression module is selected. However, if available resources are not within the constraints then the fast compression module is selected.

The compression module information that was utilized for the compression of the most recent data block is added to the compression meta-data (Block 315). This is a continuous process throughout the compression of the data set to maintain meta-data related to the process indicating, amongst other things, compression modules being utilized to compress each of the data blocks or sets of data blocks. This meta-data can also encompass other information related to the compression of data blocks. This information could be used for further analysis as well as for reproducing the original data to be decompressed and returned to the data storage, client systems or similar source. The compressed data along with meta-data can then be forwarded to be stored in the data storage or similar location (e.g., a backup data storage system) (Block 317) once all the data blocks have been completed (Block 319). The meta-data and other data can then be confirmed for storage in the data storage or similar location (e.g., the backup data storage system) (Block 321). In other embodiments, the meta-data is incrementally stored with the data blocks during the compression process.

Figure 4:
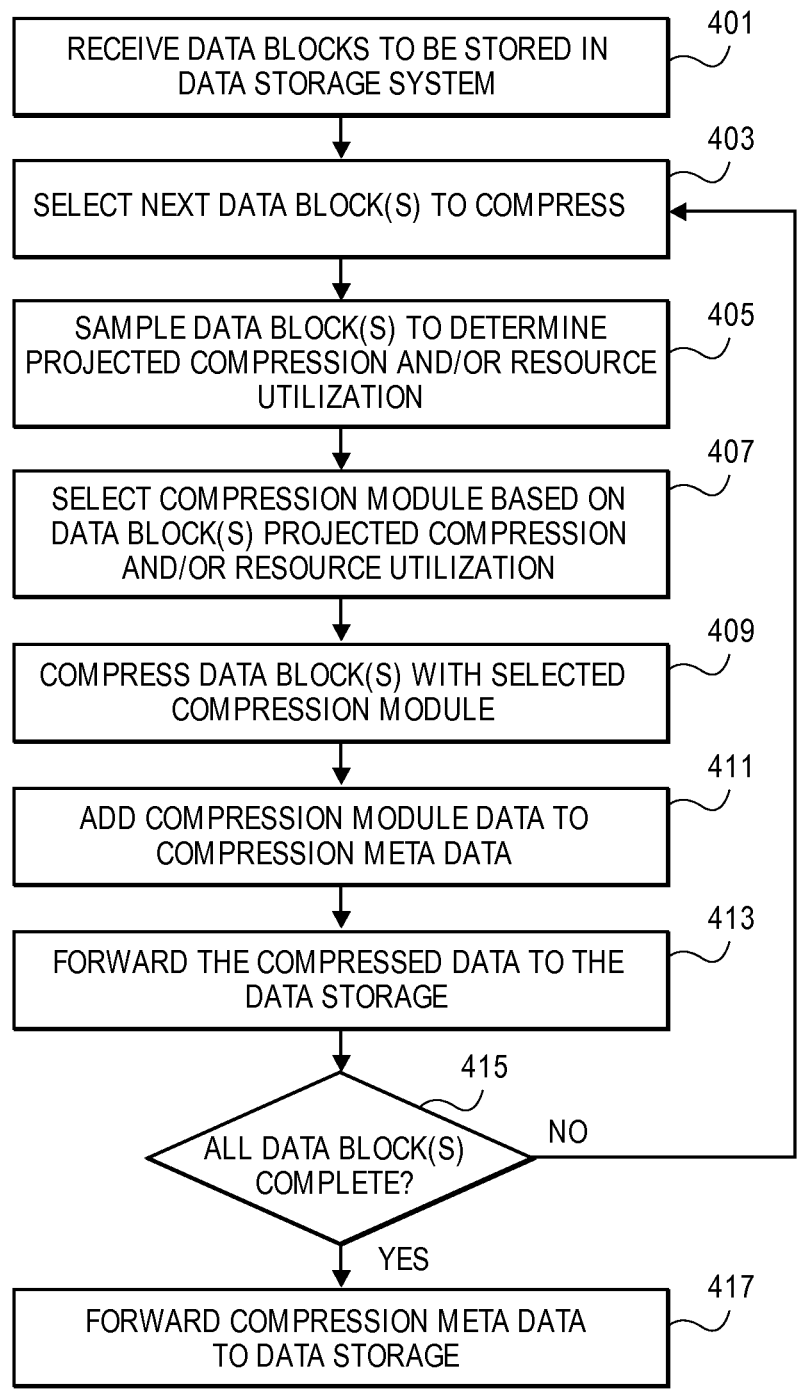
FIG. 4 is a flowchart of one embodiment of a process for dynamically selecting a compression process that relies on pre-processing or sampling of the data set.

FIG. 4 is a flowchart of one embodiment of a process for pre-processing or sampling the received data blocks to determine the compression module to be dynamically selected. In one embodiment, this process is also initiated by the reception of data blocks to be stored in the data storage or similar location (e.g., a backup data storage system) with the compression module (Block 401). The process selects the next data block or set of data blocks to be compressed (Block 403). As with the other dynamic compression selection processes, this processing can either be sequential, parallel or any combination thereof. The received data blocks to be compressed are then sampled or filtered or similarly pre-processed to determine the projected compression and/or resource utilization for the data (Block 405). The filters or pre-processing can include using a weak compressor such as Lempel-Ziv, counting repeated byte sequences, estimating the count of repeated byte sequences with an approximation technique such as using a bloom filter, by sampling redundant data pattern occurrences using hash tables or bloom filters over all or sampled portions of the data or by using similar techniques. In one embodiment, the sampling process applies a plurality of the available compression modules to a data block, portion of the data block or a subset of a larger set of data blocks. The compression module with the best projected compression efficacy or resource utilization or meeting similar selection criteria can then be selected for use with the data block, the larger set of data blocks (e.g., a sequence of data blocks, data blocks with similar characteristics or a similarly related set of data blocks) or any subset of that larger set of data blocks.

Based on the pre-processing analysis, the compression module with the best compression and/or resource utilization for the identified type of data block or set of data blocks is selected (Block 407). The data blocks that have been selected are compressed with the selected compression module (Block 409). Any number of data blocks can be compressed, before a further sampling or similar pre-processing is selected. The size of the sequences can be configured by a user or administrator. With compression of each module and selection of each compression module, the meta-data is updated to reflect these changes and to record the correspondence between the data blocks and or group of data blocks and the compression module being utilized to compress them. The compressed data is also forwarded to the data storage or similar location (e.g., a backup storage device) for storage as it is compressed (Block 413). A check is made to determine whether all of the data blocks have been completed (Block 415). If all of the data blocks have been completed or if they have not all been received, then the compression process continues by selecting the next data blocks to compress (Block 403).

However, if all of the data blocks have been compressed or processed, then the compression metadata is also stored in the data storage or similar location (e.g., a backup data storage system) for use in decompressing the data or restoring the data to the client system and for future analysis. In another embodiment, the compression metadata is incrementally stored with each data block, rather than separately stored at the end of the compression process.

Each of the compression systems is compatible with additional post processing as described above including the scheduling of additional less efficient but higher compression level compression processes and similar post processing.

Figure 5:
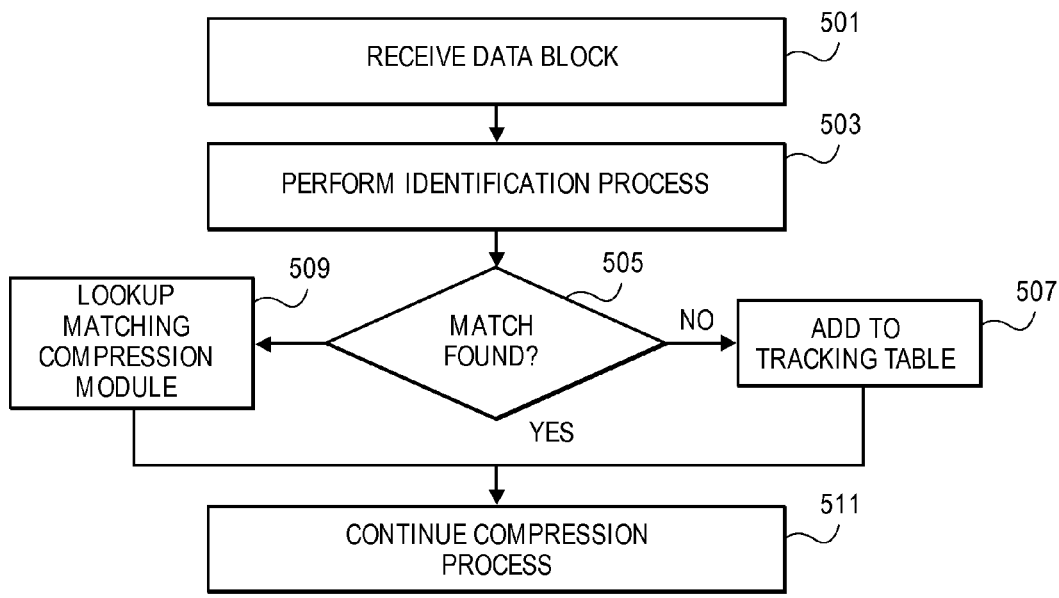
FIG. 5 is a flowchart of one embodiment of a process for tracking compression information for application to the compression module selection.

FIG. 5 is a flowchart of one embodiment of a process for tracking compression information for application to the compression module selection. In one embodiment, data blocks can be identified as they are being processed by analysis of their content, location, source or similar information about the data blocks. This information and identification of the data blocks enable the tracking of the effectiveness of compression modules in compressing similar data blocks. This tracked information can be maintained to enable the quick lookup of effective compression modules for application in the compression process.

In one embodiment, the process can be implemented by a compression tracking module. The data blocks can be passed to the compression tracking module by the compression management module or other component (Block 501). The identification process is then executed over the data block (Block 503). In one example embodiment, the identification process is a resemblance hash or similar process for generating an approximate or exact identification of the data block. The identification process can operate over any data associated with the data block including the content of the data block, location information (e.g., within a data structure, storage device or file), source computer information, port information or similar information related to the data block. The identification process can generate a tag or similar identifier that is unique or similarly tied to the data block or a set of data blocks with similar characteristics.

This tag or identifier can then be applied to a look up table or similar data structure to determine whether a previously processed data block has been analyzed and its tag or identifier recorded by the compression tracking module (Block 505). The look up table can be stored in any location accessible to the compression tracking module. The look up table can have any size or structure and can correlate identifiers to effective compression modules and similar information. If a match is found between the data block identifier and an identifier in the look up table, then the correlated compression module information can be retrieved (Block 509). This information can be provided to the compression selection module to factor into or guide the selection of a compression module for the data block (Block 510).

If a match was not found, then the data block identifier can be added to the table along with a current compression module or similar compression module information (e.g., a default compression module). This information can be updated or maintained as the data block is compressed to guide future compression of similar data block based on whether the applied compression modules are effective (Block 511).

The processes or methods depicted in the preceding figures may be performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially. Embodiments of the present invention are not described with reference to any particular programming language. It will be appreciated that a variety of programming languages may be used to implement the teachings of embodiments of the invention as described herein.

The techniques shown in the figures can be implemented using code and data stored and executed on one or more electronic devices (e.g., a server, a workstation, etc.). Such electronic devices store and communicate (internally and/or with other electronic devices over a network) code and data using non-transitory machine-readable or computer-readable media, such as non-transitory machine-readable or computer-readable storage media (e.g., magnetic disks; optical disks; random access memory; read only memory; flash memory devices; and phase-change memory). In addition, such electronic devices typically include a set of one or more processors coupled to one or more other components, such as one or more storage devices, user input/output devices (e.g., a keyboard, a touch screen, and/or a display), and network connections. The coupling of the set of processors and other components is typically through one or more busses and bridges (also termed as bus controllers). The storage devices represent one or more non-transitory machine-readable or computer-readable storage media and non-transitory machine-readable or computer-readable communication media. Thus, the storage device of a given electronic device typically stores code and/or data for execution on the set of one or more processors of that electronic device. Of course, one or more parts of an embodiment of the invention may be implemented using different combinations of software, firmware, and/or hardware.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A computer-implemented method for compressing a data set, the method comprising:
   receiving a first data block of a data set and a plurality of additional data blocks of the data set having similar characteristics as the first data block of the data set;
   sampling the first data block to identify a content type of the first data block, the sampled first data block containing only a portion of the first data block;
   selecting automatically, by a compression management module executed by a processor, a compression module from a plurality of compression modules to apply to the first data block based on the identified content type of the first data block, wherein automatically selecting a compression module comprises:
      individually applying each of the plurality of compression modules to the sampled first data block, generating a plurality of compressed samples of the first data block,
      determining a compression efficacy for each of the compressed samples of the first data block, and
      selecting the compression module whose compressed sample of the first data block has a best compression efficacy, independent of whether the best compression efficacy meets a threshold amount of compression;
   compressing the entire first data block, and a plurality of additional data blocks of the data set having similar characteristics as the first data block of the data set, with the selected compression module to generate a first compressed data block and a plurality of compressed additional data blocks;
   storing the first compressed data block, and the plurality of compressed additional data blocks of the data set, in a storage device, such that a storage space of the storage device required to store the first compressed data block and the plurality of compressed additional data blocks is less than the storage space required to store the first data block and the plurality of additional data blocks;
   constraining or expanding the plurality of compression modules from a set of available compression modules by applying a sliding scale of trade-off between available computational resources and a computational requirement of each compression module of the set of available compression modules;
   analyzing a plurality of recently compressed data blocks to determine a pattern of the data blocks having been recently compressed that indicates that a different compression module of the plurality of constrained or expanded compression modules would be more efficient than the selected compression module, wherein a compression module is more efficient if it produces more data reduction with the same resources or uses fewer resources for the same amount of data reduction; and
   selecting the different compression module of the plurality of constrained or expanded compression modules to compress a next data block.

2. The computer-implemented method of claim 1, further comprising:
   adding compression module information to compression meta-data for the data set.

3. The computer-implemented method of claim 2, further comprising:
   determining an identifier for the first data block; and
   looking up the compression module, by a compression tracking module, using the identifier.

4. The computer-implemented method of claim 1, further comprising:
   storing statistical data of the first compressed data block with statistical data for the data set.

5. The computer-implemented method of claim 1, further comprising:
   scheduling further processing of the first compressed data block.

6. The computer-implemented method of claim 1, further comprising:
   receiving a second data block of the data set; and
   selecting another compression module from the plurality of compression modules to apply to the second data block based on projected compression efficacy or resource utilization.

7. The computer-implemented method of claim 6, further comprising:

adding compression module information for the second data block to compression meta-data for the data set.

8. The computer-implemented method of claim 6, further comprising:
compressing the second data block of the data set with the another compression module to generate a second compressed data block.

9. The computer-implemented method of claim 6, wherein the first data block and the second data block are data blocks of a single file.

10. The computer-implemented method of claim 1, wherein the selection of the compression module for the first data block is further based on available computational resources.

11. A non-transitory computer-readable storage medium having instructions stored therein, which when executed by a computer, cause the computer to perform a set of operations for compressing a data set, the set of operations comprising:
receiving a first data block of the data set;
sampling the first data block to identify a content type of the first data block, the sampled first data block containing only a portion of the first data block;
selecting automatically by a compression management module a compression module from a plurality of compression modules to apply to the first data block based on the identified content type of the first data block, wherein automatically selecting a compression module comprises:
individually applying each of the plurality of compression modules to the sampled first data block, generating a plurality of compressed samples of the first data block,
determining a compression efficacy for each of the compressed samples of the first data block, and
selecting the compression module whose compressed sample of the first data block has a best compression efficacy, independent of whether the best compression efficacy meets a threshold amount of compression;
compressing the entire first data block and a plurality of additional data blocks of the data set having similar characteristics as the first data block of the data set with the selected compression module to generate a first compressed data block and a plurality of compressed additional data blocks;
storing the first compressed data block and the plurality of compressed additional data blocks in a storage device, such that a storage space of the storage device required to store the first compressed data block and the plurality of compressed additional data blocks is less than the storage space required to store the first data block and the plurality of additional data blocks;
constraining or expanding the plurality of compression modules from a set of available compression modules by applying a sliding scale of trade-off between available computational resources and a computational requirement of each compression module of the set of available compression modules;
analyzing a plurality of recently compressed data blocks to determine a pattern of the data blocks having been recently compressed that indicates that a different compression module of the plurality of constrained or expanded compression modules would be more efficient than the selected compression module, wherein a compression module is more efficient if it produces more data reduction with the same resources or uses fewer resources for the same amount of data reduction; and
selecting the different compression module of the constrained or expanded compression modules to compress a next data block.

12. The non-transitory computer-readable storage medium of claim 11, further including operations comprising:
adding compression module information to compression meta-data for the data set.

13. The non-transitory computer-readable storage medium of claim 12, further including operations comprising:
determining an identifier for the first data block; and
looking up the compression module, by a compression tracking module, using the identifier.

14. The non-transitory computer-readable storage medium of claim 11, further including operations comprising:
storing statistical data of the first compressed data block with statistical data for the data set.

15. The non-transitory computer-readable storage medium of claim 11, further including operations comprising:
scheduling further processing of the first compressed data block.

16. A data processing system, comprising:
a processor; and
a memory storing instructions which when executed by the processor, cause the processor to perform operations, the operations including
receiving a first data block of a data set,
sampling the first data block to identify a content type of the first data block, the sampled first data block containing only a portion of the first data block,
selecting automatically by a compression management module executed by the processor a compression module from a plurality of compression modules to apply to the first data bock based on the identified content type of the first data block, wherein automatically selecting a compression module comprises:
individually applying each of the plurality of compression modules to the sampled first data block, generating a plurality of compressed samples of the first data block,
determining a compression efficacy for each of the compressed samples of the first data block, and
selecting the compression module whose compressed sample of the first data block has a best compression efficacy, independent of whether the best compression efficacy meets a threshold amount of compression,
compressing the entire first data block and a plurality of additional data blocks of the data set having similar characteristics as the first data block of the data set with the selected compression module to generate a first compressed data block and a plurality of compressed additional data blocks,
storing the first compressed data block and the plurality of compressed additional data blocks in a storage device, such that a storage space of the storage device required to store the first compressed data block and the plurality of compressed additional data blocks is less than the storage space required to store the first data block and the plurality of additional data blocks, constraining or expanding the plurality of compression modules from a set of available compression modules by applying a sliding scale of trade-off between available computational resources and a computational requirement of each compression module of the set of available compression modules, analyzing a plurality of recently compressed data blocks to determine a pattern of the data blocks having been recently compressed that indicates that a different compression module of the plurality of constrained or expanded compression modules would be more efficient than the selected compression module, wherein a compression module is more efficient if it produces more data reduction with the same resources or uses fewer resources for the same amount of data reduction; and selecting the different compression module of the plurality of constrained or expanded compression modules to compress a next data block.

17. The system of claim 16, wherein the operations further comprise:

adding compression module information to compression meta-data for the data set.

18. The system of claim 17, wherein the operations further comprise:

determining an identifier for the first data block; and looking up the compression module, by a compression tracking module, using the identifier.

19. The system of claim 16, wherein the operations further comprise storing statistical data of the first compressed data block with statistical data for the data set.

20. The system of claim 16, wherein the operations further comprise scheduling further processing of the first compressed data block.

* * * * *